(12) United States Patent
Lee

(10) Patent No.: US 8,441,857 B2
(45) Date of Patent: May 14, 2013

(54) PROGRAMMING A NONVOLATILE MEMORY DEVICE USING A BIAS VOLTAGE TO A WELL OF A MEMORY BLOCK

(75) Inventor: Seungwon Lee, Yongin-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 245 days.

(21) Appl. No.: 12/829,623

(22) Filed: Jul. 2, 2010

(65) Prior Publication Data

US 2011/0019476 A1  Jan. 27, 2011

(30) Foreign Application Priority Data

Jul. 21, 2009  (KR) .................. 10-2009-0066362

(51) Int. Cl.
*G11C 11/34* (2006.01)
(52) U.S. Cl.
USPC ................................ 365/185.18; 365/185.27
(58) Field of Classification Search ............ 365/185.18, 365/185.05, 185.11, 185.27, 185.17, 185.25, 365/185.26
See application file for complete search history.

(56) References Cited

U.S. PATENT DOCUMENTS

| | | | |
|---|---|---|---|
| 5,920,506 A * | 7/1999 | Wang et al. | 365/185.18 |
| 6,512,702 B1 | 1/2003 | Yamamura et al. | |
| 6,925,005 B2 * | 8/2005 | Kawamura et al. | 365/185.12 |
| 2005/0117399 A1 * | 6/2005 | Kwon et al. | 365/185.28 |
| 2005/0253198 A1 | 11/2005 | Lee | |
| 2006/0133142 A1 | 6/2006 | Futatsuyama | |
| 2007/0115724 A1 | 5/2007 | Hwang | |

FOREIGN PATENT DOCUMENTS

| | | |
|---|---|---|
| JP | 2005-328023 | 11/2005 |
| JP | 2006-179065 | 7/2006 |
| JP | 2007-149322 | 6/2007 |
| KR | 2005-0108143 | 11/2005 |
| KR | 10-0742278 | 7/2007 |

* cited by examiner

*Primary Examiner* — Vanthu Nguyen
*Assistant Examiner* — Khamdan Alrobaie
(74) *Attorney, Agent, or Firm* — Stanzione & Kim, LLP

(57) ABSTRACT

A nonvolatile memory device is provided which includes a plurality of memory blocks, a bias block and a control logic block. The memory blocks are formed in wells, respectively. The bias block biases a well of a selected memory block. The control logic block controls the bias block to pre-charge doping regions of the selected memory block to a junction voltage before word line voltages are applied to the selected memory block in a programming operation.

19 Claims, 11 Drawing Sheets

PROGRAMMING A NONVOLATILE MEMORY DEVICE USING A BIAS VOLTAGE TO A WELL OF A MEMORY BLOCK

CROSS-REFERENCE TO RELATED APPLICATIONS

This U.S. non-provisional patent application claims priority under 35 U.S.C. §119 from Korean Patent Application No. 10-2009-0066362, filed on Jul. 21, 2009, the entire contents of which are hereby incorporated by reference.

BACKGROUND

1. Field of the Invention

The present disclosure herein relates to a semiconductor memory device, and more particularly, to a nonvolatile memory device.

2. Description of the Related Art

As a nonvolatile memory device, a flash memory device is a kind of Electrical Erasable Programmable Read Only Memory (EEPROM) where a plurality of memory regions are erased or programmed through a one-time programming operation. Typical EEPROMs enable one memory region to be erased or programmed only once. This denotes that flash memory devices may operate at a faster and more effective speed than when systems using the flash memory devices read and write different memory regions at the same time. All the types of flash memories and EEPROMs are worn after a specific number of erasure operations due to the deterioration of a charge storage means that is used to store data or the wear of a dielectric layer surrounding the charge storage means.

Flash memory devices store information in a silicon chip in a method that does not require a power source in retaining the information which is stored in the silicon chip. This denotes that information is retained without consuming a power source when the power source supplied to a chip is shut off. Additionally, flash memory devices provide resistance to physical impact and a fast read access time. Because of these characteristics, the flash memory devices are generally used as the storage devices of systems that receive a power source from a battery.

SUMMARY

The present general inventive concept provides a nonvolatile memory device and a programming method thereof, which can improve reliability.

Additional features and utilities of the present general inventive concept will be set forth in part in the description which follows and, in part, will be obvious from the description, or may be learned by practice of the present general inventive concept.

Exemplary embodiments of the present general inventive concept can provide a nonvolatile memory device including a plurality of memory blocks formed in wells, respectively, a bias block to bias a well of a selected memory block, and a control logic block to control the bias block to pre-charge doping regions of the selected memory block to a junction voltage before word line voltages are applied to the selected memory block in a programming operation.

Exemplary embodiments of the present general inventive concept can also provide a method of programming a nonvolatile memory device including a plurality of memory blocks. The programming method can include pre-charging doping regions of a selected memory block of the plurality of memory blocks, to a junction voltage, driving bit lines of the selected memory block to one of a bit line programming voltage and a bit line program-inhibition voltage according to data to be programmed, driving word lines of the selected memory block to a pass voltage, and driving a selected one of the word lines in the selected memory block to a programming voltage, where the memory blocks are respectively formed in independent wells.

Exemplary embodiments of the present general inventive concept can also provide a programming method of a nonvolatile memory device including a plurality of memory blocks. The programming method can include supplying a junction voltage to a selected one of the memory blocks, each formed in independent wells, before supplying a selected word line in the selected memory block with a programming voltage.

Exemplary embodiments of the present general inventive concept also provide a memory system which includes a nonvolatile memory device, and a controller controlling the nonvolatile memory device, where the nonvolatile memory device comprises a plurality of memory blocks formed in wells, respectively.

Exemplary embodiments of the present general inventive concept also provide a nonvolatile memory device, including a memory cell array having a plurality of memory blocks that are respectively formed in independent wells, a controller to independently control the driving of the respective wells of the memory blocks, a row decoder to select one or more of the plurality of memory blocks according to a control signal received from the controller, and an operation logic unit to read data from and write data to the memory cell array according to a control signal received from the controller.

The nonvolatile memory device can also include a bias apparatus to generate a voltage to control at least one of a read operation, a write operation, and a programming operation according to a control signal received from the controller.

The nonvolatile memory device can also include an interface to provide a signal path between the nonvolatile memory device an external device communicatively coupled to the interface.

The nonvolatile memory device can also include at least one switch block corresponding to each of the plurality of memory blocks of the memory cell array, where the at least one switching block is formed in an independent well.

The nonvolatile memory device can also include where the row decoder controls the selection and driving of the one or more of the plurality of memory blocks and the at least one switching block according to a control signal received from the controller.

Exemplary embodiments of the present general inventive concept also provide a method of programming a nonvolatile memory device having a plurality of memory blocks in independent wells, the method including loading data into an operation logic unit to be stored in a selected memory block of the plurality of memory blocks, supplying a junction pre-charge voltage to a well of the selected memory block, discharging the junction pre-charge voltage, and programming the plurality of memory blocks according to loaded data.

The method can also include maintaining the voltages of the doping regions of at least the selected memory block.

The method can also include supplying a pass voltage to one or more word lines so that memory cells of the selected memory block are turned on.

Exemplary embodiments of the present general inventive concept may also provide a memory system, including a nonvolatile memory device having a memory cell array having a plurality of memory blocks that are respectively formed in independent wells, a first controlled controller to independently control the driving of the respective wells of the memory blocks, a row decoder to select one or more of the plurality of memory blocks according to a control signal received from the first controller, and an operation logic unit to read data from and write data to the memory cell array according to a control signal received from the first controller, and a second controller to control the nonvolatile memory device.

BRIEF DESCRIPTION OF THE DRAWINGS

The above features and/or utilities of the present general inventive concept will become apparent and more readily appreciated from the following description of the exemplary embodiments, taken in conjunction with the accompanying drawings. The accompanying drawings are included to provide a further understanding of the inventive concept, and are incorporated in and constitute a part of this specification. The drawings illustrate exemplary embodiments of the present general inventive concept and, together with the description, serve to explain principles of the present general inventive concept. In the drawings.

DETAILED DESCRIPTION OF THE EMBODIMENTS

Figure 1:
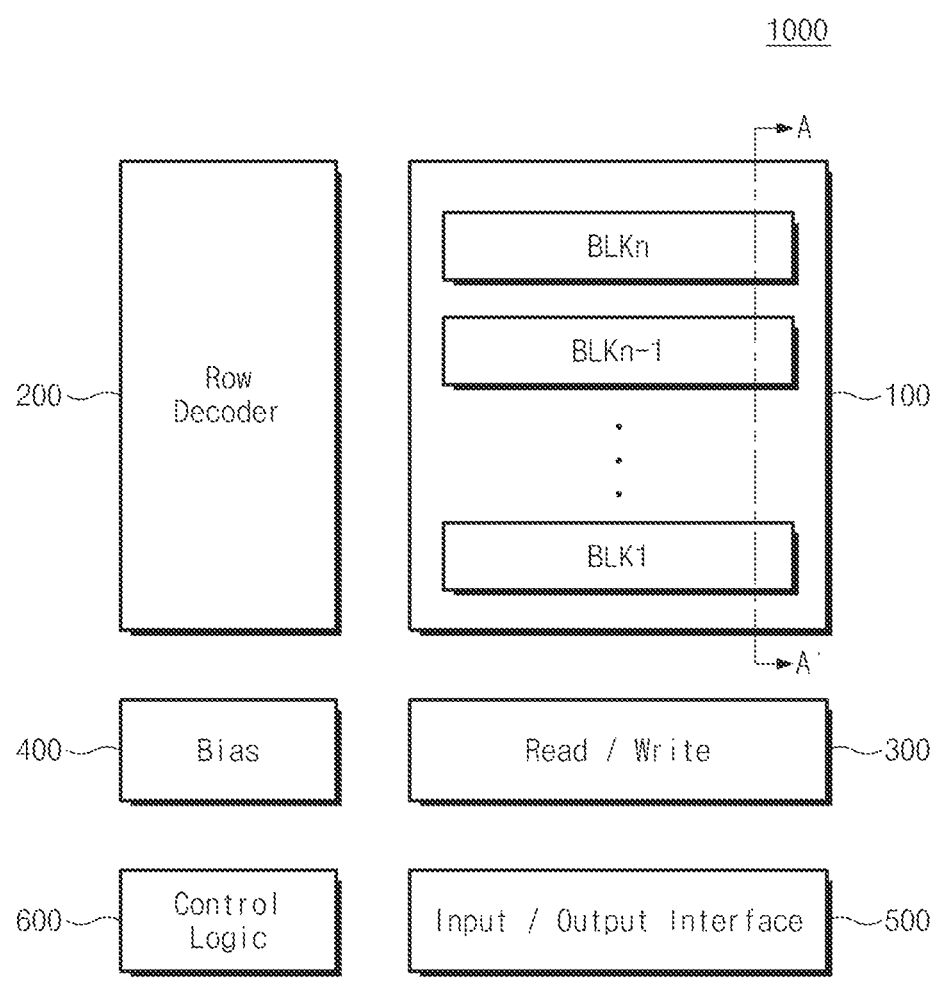
FIG. 1 is a block diagram schematically illustrating a nonvolatile memory device according to exemplary embodiments of the present general inventive concept.

The present general inventive concept is described more fully hereinafter with reference to the accompanying drawings, in which exemplary embodiments of the present general inventive concept are illustrated. The present general inventive concept may, however, be embodied in many different forms and should not be construed as limited to the embodiments set forth herein. Rather, these exemplary embodiments are provided so that this disclosure will be thorough and complete, and will fully convey the scope of the present general inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 2:
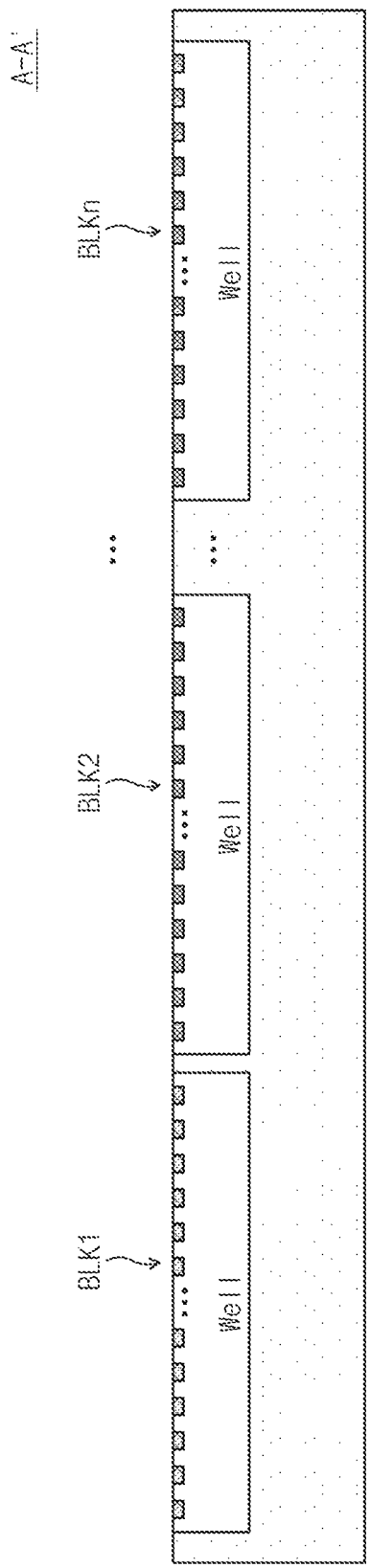
FIG. 2 is a cross-sectional view schematically illustrating a cross-sectional surface taken along dot line A-A' of FIG. 1 according to exemplary embodiments of the present general inventive concept.

FIG. 1 is a block diagram schematically illustrating a nonvolatile memory device according to exemplary embodiments of the present general inventive concept. FIG. 2 is a cross-sectional view schematically illustrating a cross-sectional surface taken along a dotted line A-A' of FIG. 1.

Referring to FIG. 1, a nonvolatile memory device 1000 according to exemplary embodiments of the present general inventive concept can include a memory cell array 100, a row decoder block 200, a read/writing block 300, a bias block 400, an input/output interface block 500, and a control logic block 600.

The memory cell array 100 can store data and can include memory cells that are arranged in rows and columns. The memory cells can configure a plurality of memory blocks BLK0 to BLKn. Each of the memory cells can store 1-bit data or M-bit data (M being 2 or more integer). Each of the memory cells can be a memory cell having a charge storage layer such as a charge trapping layer or a floating gate, a memory cell, having a variable resistor, such as a Phase-change Random Access Memory (PRAM) cell, a Ferroelectric Random Access Memory (FRAM) cell, or a Magnetoresistive Random Access Memory (MRAM) cell, or the like. However, the structure of the memory cell is not limited thereto. The memory blocks BLK1 to BLKn included in the memory cell array 100 are typically not formed in a single well but can be formed individually in corresponding wells. In other words, as illustrated in FIG. 2, the memory block BLK1 can be formed in a corresponding independent well, the memory block BLK2 can be formed in a corresponding independent well, and the memory block BLKn can be formed in a corresponding independent well. As the memory blocks BLK1 to BLKn can be respectively formed in independent wells, the driving of the wells of the memory blocks BLK1 to BLKn may be independently controlled.

In exemplary embodiments of the present general inventive concept, wells can be P-type wells. The P-type wells can be formed in an N-type well that is formed on a semiconductor substrate. That is, the memory cell array 100 can have a triple-well structure. However, the well structure of the memory cell array 100 is not limited thereto.

Figure 3:
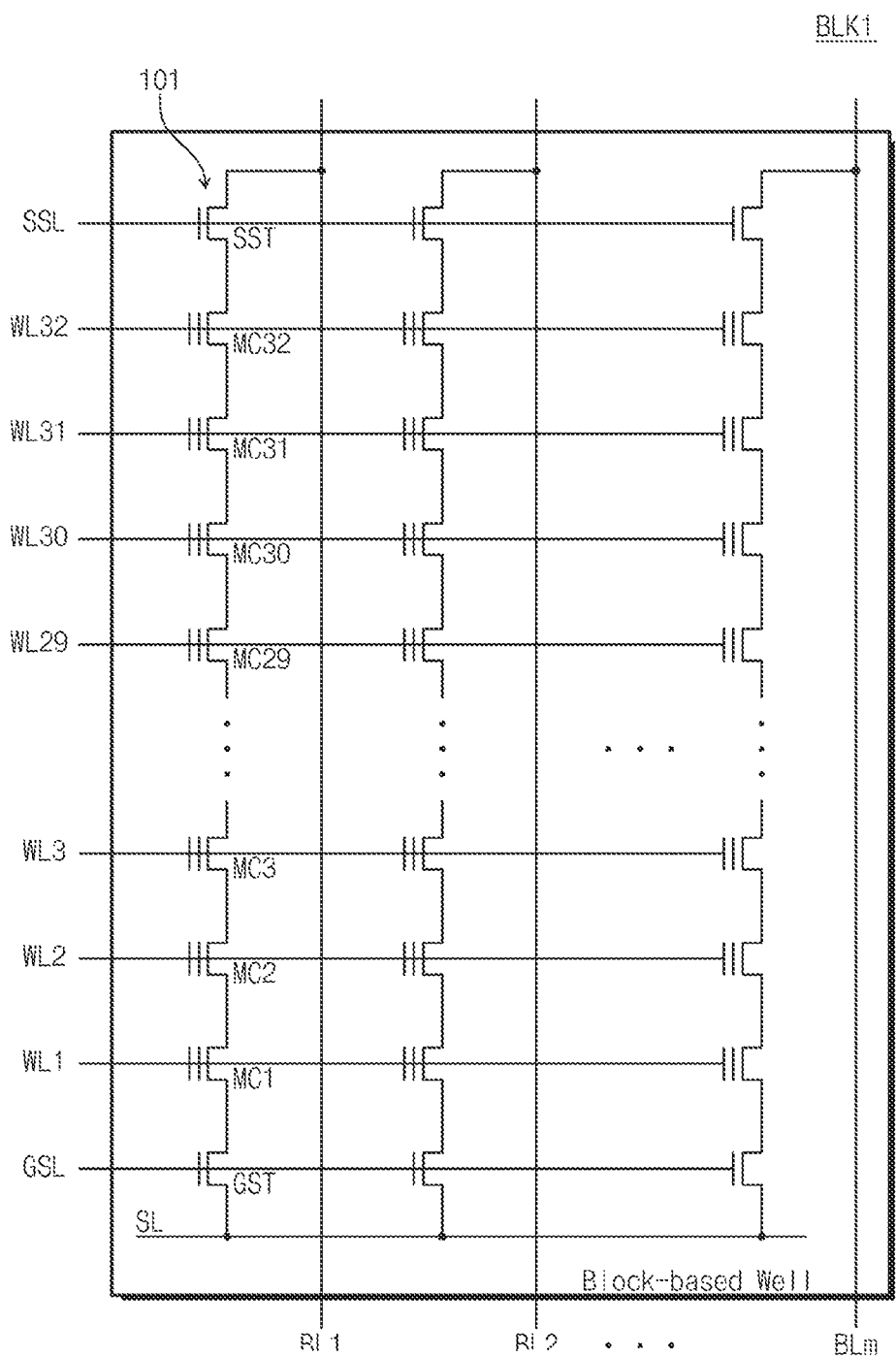
FIG. 3 is a circuit diagram schematically illustrating any one of memory blocks in FIG. 1 according to exemplary embodiments of the present general inventive concept.

Referring continuously to FIG. 1, the row decoder block 200 can operate responsive to the control of the control logic block 600 (e.g., the operation of the row decoder block 200 is controlled by a least one control signal received by the control logic block 600) and can select the memory blocks BLK0 to BLKn of the memory cell array 100. The row decoder block 200 can control the driving of rows (i.e., word lines WL1, WL2, . . . , WL32 as illustrated in FIG. 3) of a memory block (e.g., memory blocks BLK0 to BLKn of the memory cell array 100) that is selected according to an operation mode (e.g., where an operation mode can include a reading mode, a writing mode, and/or a programming mode). The read/writing block 300 can operate responsive to the control of the control logic block 600 (e.g., the read/writing block 300 can operate according to at least one received control signal from the control logic block 600) and can read/write data from/in the memory cell array 100. For example, the read/writing block 300 can operate as a sense amplifier to read data from the memory cell array 100 during a read/verification read operation. The read/writing block 300 can operate as a write driver to write data in the memory cell array 100 during a writing operation (or, a programming operation). The bias block 400 can operate responsive to the control of the control logic block 600 (e.g., the bias block 400 can be operating according to at least one control signal received from the control logic block 600) and can generate voltages (for example, word line voltages, well voltages and bit line voltages) for one or more operations (e.g., for each operation, where operations can include a read operation, a write operation, a programming operation, or any other suitable operation to carry out the exemplary embodiments of the present general inventive concept as disclosed herein). The input/output interface block 500 can operate responsive to the control of the control logic block 600 (e.g., the input/output interface block 500 can operate according to at least one control signal received from the control logic block 600) and can provide a signal path between the elements of the nonvolatile memory device 1000 and an external device (for example, a memory controller, a host processing unit, a computer, a server, or any other suitable external device to carry out the exemplary embodiments of the present general inventive concept as disclosed herein).

Exemplary embodiments of the present general inventive concept can also provide that the control logic block 600 controls the bias block 400 so as to pre-charge doping regions of a selected memory block (e.g., memory blocks BLK1 to BLKn) with a junction voltage before word line voltages are applied to a selected memory block in a programming operation.

FIG. 3 is a circuit diagram schematically illustrating any one of the memory blocks e.g., memory blocks BLK1 to BLKn) of FIG. 1. Only one memory block BLK1 is illustrated in FIG. 3. However, the remaining memory blocks BLK2 to BLKn in the memory cell array 100 can be configured substantially identically to that illustrated in FIG. 3. The memory block BLK1 can include strings 101 that respectively correspond to bit lines BL1 to BLm. As described above with reference to FIG. 2, the memory block BLK1, i.e., the strings 101 are formed in an independent well. In exemplary embodiments of the present general inventive concept, the strings 101 can be identical to one another. That is, the strings 101 in the memory block (e.g., memory block BLK1) can be identical to one another.

Each of the strings 101 can include a string selection transistor SST, a ground selection transistor GST, and memory cells MC1 to MC32 serially connected between the selection transistors SST and GST. The string selection transistors SST of the strings 101 can be controlled in common through the string selection line SSL, and the ground selection transistors GST of the strings 101 can be controlled in common through the ground selection line GSL. The memory cells in each row can be controlled in common through a corresponding word line (e.g., word line WL1, WL2, . . . , WL32). For example, the memory cells MC1 in the first row can be controlled in common through a word line WL1, the memory cells MC2 in the second row can be controlled in common through a word line WL2, and the memory cells MC32 in the last row can be controlled in common through a word line WL32.

In FIG. 3, although only thirty-two word lines WL1 to WL32 are arranged in the memory block BLK1 as an example, exemplary embodiments of the present general inventive concept are not limited thereto. For example, the memory block BLK1 may include 16 word lines, 64 word lines, or 128 word lines, or any other suitable number of word line to carry out the exemplary embodiments of the present general inventive concept as disclosed herein.

In exemplary embodiments of the present general inventive concept, the bit lines BL1 to BLm are arranged to be shared by the memory blocks BLK1 to BLKn. The bit lines BL1 to BLm can be connected to the read/writing block 300. However, the arrangement of the bit lines BL1 to BLm is not limited thereto. For example, the bit lines BL1 to BLm may be arranged in the each memory block and may be connected to the read/writing block 300 through global bit lines (e.g., global bit lines GBL1 to GBLm illustrated in FIGS. 6 and 8). That is, the memory cell array 100 may have a hierarchical bit line structure.

Figure 4:
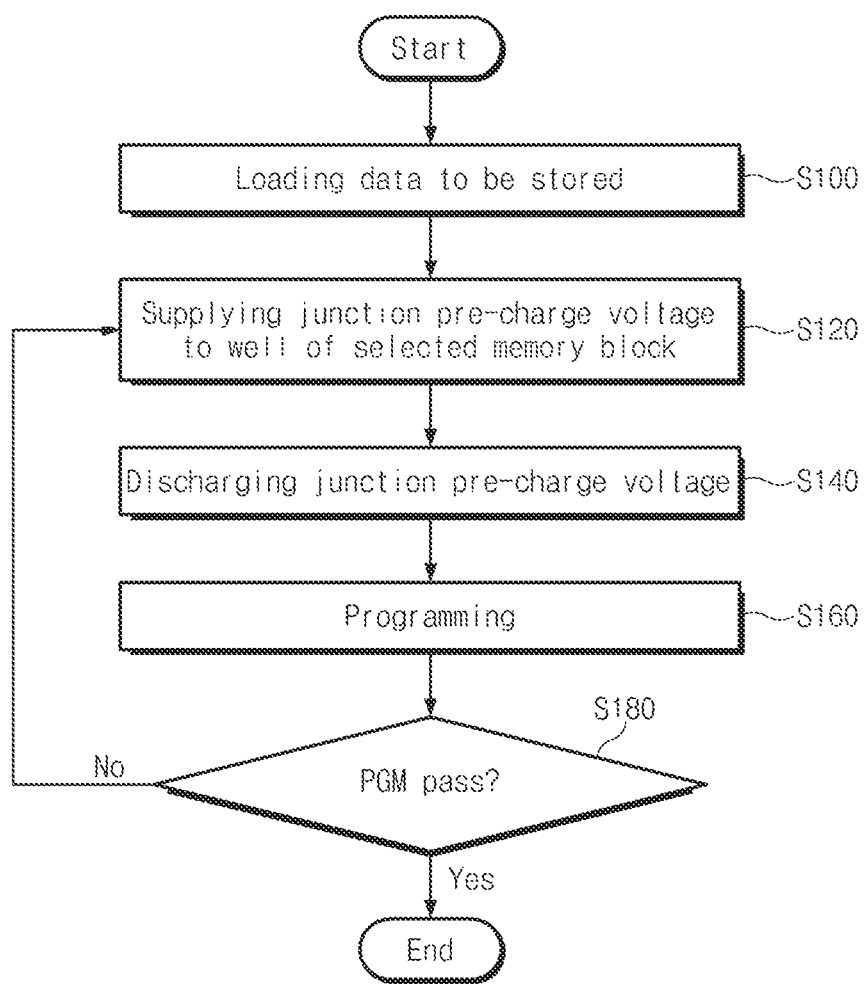
FIG. 4 is a flowchart illustrating a programming method of a nonvolatile memory device according to exemplary embodiments of the present general inventive concept.
Figure 5:
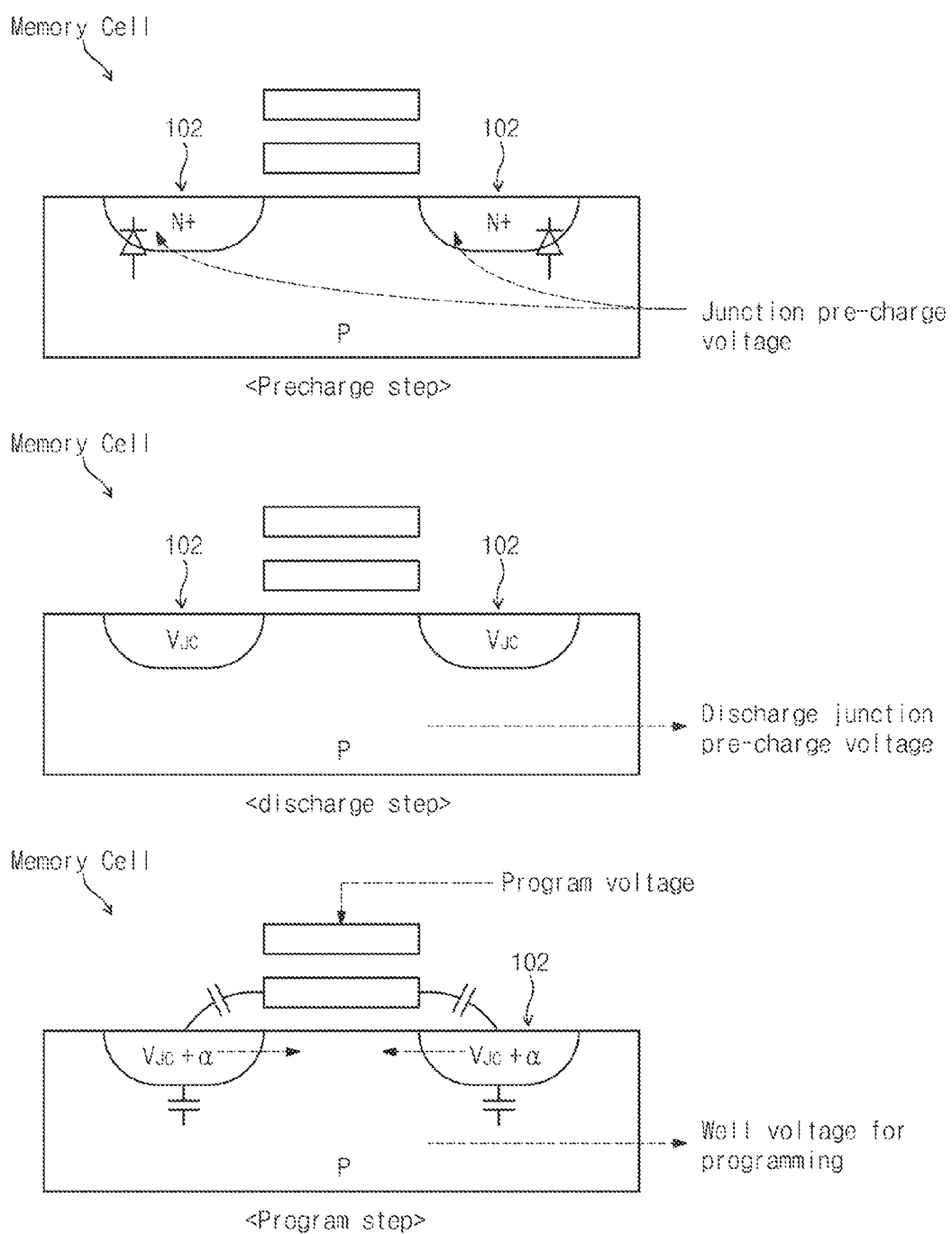
FIG. 5 is a diagram illustrating the voltage shift of a cell junction in a programming method according to exemplary embodiments of the present general inventive concept.

FIG. 4 is a flowchart illustrating a programming method of a nonvolatile memory device according to exemplary embodiments of the present general inventive concept. FIG. 5 is a diagram illustrating the voltage shift of a cell junction in a programming method according to exemplary embodiments of the present general inventive concept.

Before performing a programming operation, data to be stored in the memory cell array 100 illustrated in FIG. 1 can be loaded into the read/writing block 300 through the input/output interface block 500 according to the control of the control logic block 600 in operation S100. That is, a control signal from the control logic block 600 controls the loading of the data into the read/writing block 300 through the input/output interface block 500. Before the loading of data, address information to select a memory block and a word line can be provided to the nonvolatile memory device 1000. When data to be stored in the memory cell array 100 is loaded into the read/writing block 300, the row decoder block 200 can select any one (for example, BLK1) of the memory blocks BLK1 to BLKn in response to address information according to the control of the control logic block 600. When the memory block BLK1 is selected, the control logic block 600 can control the bias block 400 such that a given voltage (hereinafter referred to as a junction pre-charge voltage) can be provided to the well of a selected memory block (for example, BLK1) in operation S120. According to such a bias condition, as PN junctions (or junction diodes) can be formed by a well and a plurality of doping regions 102 used as a source/drain, as illustrated in FIG. 5, a junction pre-charge voltage provided to a well can be transferred to the doping regions 102 that are used as the source/drain of a cell.

In exemplary embodiments of the present general inventive concept, as the source/drain voltage of each memory cell, the voltages of the doping regions 102 can be referred to as a junction voltage $V_{JC}$. A junction pre-charge voltage can be provided to the well of the selected memory block BLK1, although it may not be provided to wells of unselected memory blocks BLK2 to BLKn. As described above, as the memory blocks BLK1 to BLKn are respectively formed in independent wells, a junction pre-charge voltage may be independently provided only to the well of the selected memory block BLK1.

The junction pre-charge voltage provided to the well can be discharged through the bias block 140 according to the control of the control logic block 160 in operation S140. That is, the bias block 140 can receive a control signal from the control logic block 160 to discharge a junction pre-charge voltage. Although the junction pre-charge voltage can be discharged from the well, the voltages of the doping regions 102 may be maintained because PN junctions (or junction diodes) can be reverse biased.

The doping regions (or source/drain regions) of memory cells in the selected memory block BLK1 can be pre-charged to the junction voltage $V_{JC}$ through the above-described operations S120 and S140. Herein, the junction voltage $V_{JC}$ of the each doping region 102 can be determined by a junction pre-charge voltage. For example, the higher the junction pre-charge voltage, the higher the junction voltage $V_{JC}$ becomes.

On the other hand, the lower the junction pre-charge voltage, the lower the junction voltage $V_{JC}$ becomes.

The junction pre-charge voltage can be discharged from the well of the selected memory block BLK1, and then memory cells can be programmed according to the loaded data in operation S160. More specifically, the well of the selected memory block BLK1 can be biased to a well voltage for a programming operation. In a state where the string selection transistors SST of the selected memory block BLK1 are turned on, the bit lines BL1 to BLm can be driven to one of a bit line programming voltage and a bit line program-inhibition voltage by the read/writing block 130 according to the loaded data. Herein, when a selected memory cell is one to be programmed, the bit line programming voltage can be applied to the string of the selected memory cell, and when a selected memory cell is one to be program-inhibition, the bit line program-inhibition voltage can be applied to the string of the selected memory cell.

According to these bias conditions, as well known, the respective string selection transistors SST can be selectively shut off according to a bit line voltage. For example, the string selection transistor SST can be turned on when a bit line programming voltage is applied to a bit line, and it can be shut off when a bit line program-inhibition voltage is applied to a bit line. When the string selection transistor SST is shut off, a string (or a string channel) including the shut-off string selection transistor SST can be floated.

The word lines WL1 to WL32 of the selected memory block BLK1 can be driven to a pass voltage by the row decoder block 110 according to the control of the control logic block 160 (e.g., according to a control signal provided to the row decoder block 110 from the control logic block 160). When a pass voltage is supplied to the word lines WL1 to WL32, the memory cells of the selected memory block BLK1 can be turned on. In the case of strings 101 that are connected to bit lines having a bit line programming voltage, junction voltages $V_{JC}$ can be discharged to the bit lines when the pass voltage is supplied to the word lines WL1 to WL32. When strings 101 are floated, junction voltages $V_{JC}$ can be boosted through parasitic capacitors (see FIG. 5) when the pass voltage is supplied to the word lines WL1 to WL32. Herein, boosting by the pass voltage can be determined by a voltage difference between a junction voltage $V_{JC}$ and a floating gate (or a control gate). For example, boosting by the pass voltage can be small when the voltage difference between the junction voltage $V_{JC}$ and the floating gate (or the control gate) is small. On the other hand, boosting by the pass voltage can be large when the voltage difference between the junction voltage $V_{JC}$ and the floating gate (or the control gate) is large.

The channel voltages of the floated strings can also become higher together with the boosting of the junction voltages $V_{JC}$. The channel voltages of the floated strings can be changed by the junction voltages $V_{JC}$ because memory cells have been turned on. That is, the junction voltages $V_{JC}$ can be added to the channel voltages, and consequently, the channel voltages can become higher than a voltage determined through self-boosting.

The word lines WL1 to WL32 of the selected memory block BLK1 can be driven to a pass voltage, and a programming voltage can be supplied to the selected word line. Unselected word lines can be continuously biased to a pass voltage. The channel voltage of a memory cell (i.e., a program-inhibited memory cell) in a floated string and connected to the selected word line can be boosted with a programming voltage. Likewise, when the programming voltage is applied to the selected word line, the junction voltages $V_{JC}$ of a program-inhibited memory cell can also be secondarily boosted through parasitic capacitors (see FIG. 5) when the pass voltage is supplied to the word lines WL1 to WL32. The boosted junction voltages (for example, $V_{JC}+\alpha$, where $\alpha$ is a boosted value from one or more parasitic capacitors) can change a channel voltage. That is, the junction voltages $V_{JC}$ can be added to the channel voltage, and consequently, the channel voltage can become higher than (e.g., greater than) a voltage determined through self-boosting that can occur according to the programming voltage.

In exemplary embodiments of the present general inventive concept, although the boosting of a junction voltage can be changed by a pass voltage, it can be determined with a programming voltage.

According to the above description, the channel voltages of the memory cells in floated strings may increase by setting/pre-charging the doping regions 102 to a junction voltage $V_{JC}$. When a program-inhibited memory cell is connected to a selected word line, particularly, a voltage difference between a programming voltage and a channel voltage upon pre-charging of the doping regions 102 with the junction voltage $V_{JC}$ decreases, in comparison with a voltage difference between the programming voltage and the channel voltage upon no pre-charging of the doping regions 102 with the junction voltage $V_{JC}$. This denotes that a stress (for example, a programming voltage stress) forced to a program-inhibited memory cell in the selected word line can decrease. With the decrease in the stress forced to the program-inhibited memory cell, electric charges can be reduced and/or prevented from being injected unintendedly into the program-inhibited memory cell. With the decrease in a design rule (or a cell size), unintended injection of electric charges to the program-inhibited memory cell due to the programming voltage can become serious. The reliability of the memory cells (or the nonvolatile memory device) can improve by decreasing the programming voltage stress through the above-described programming method.

Figure 6:
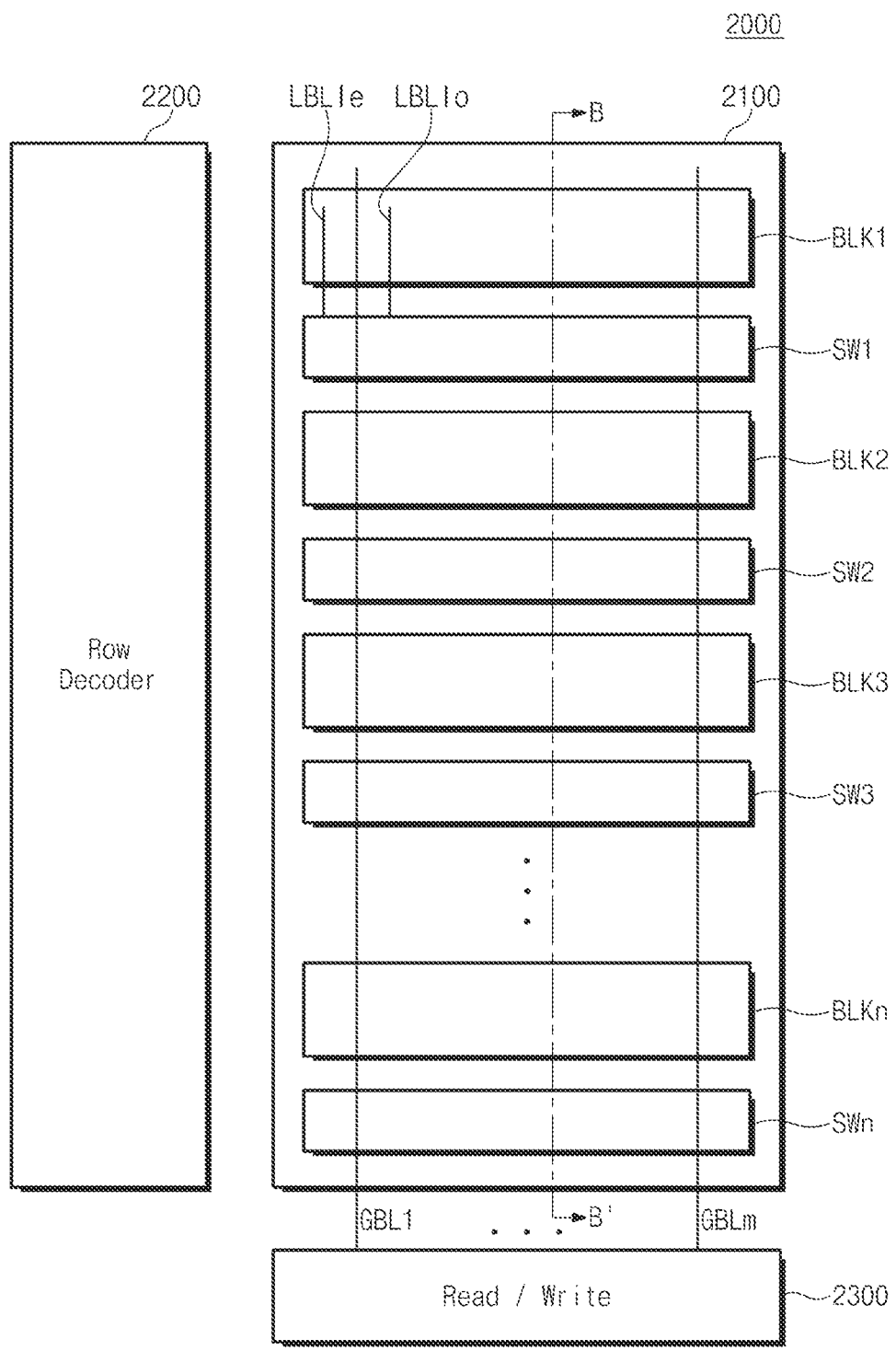
FIG. 6 is a block diagram schematically illustrating a nonvolatile memory device according to exemplary embodiments of the present general inventive concept.
Figure 7:
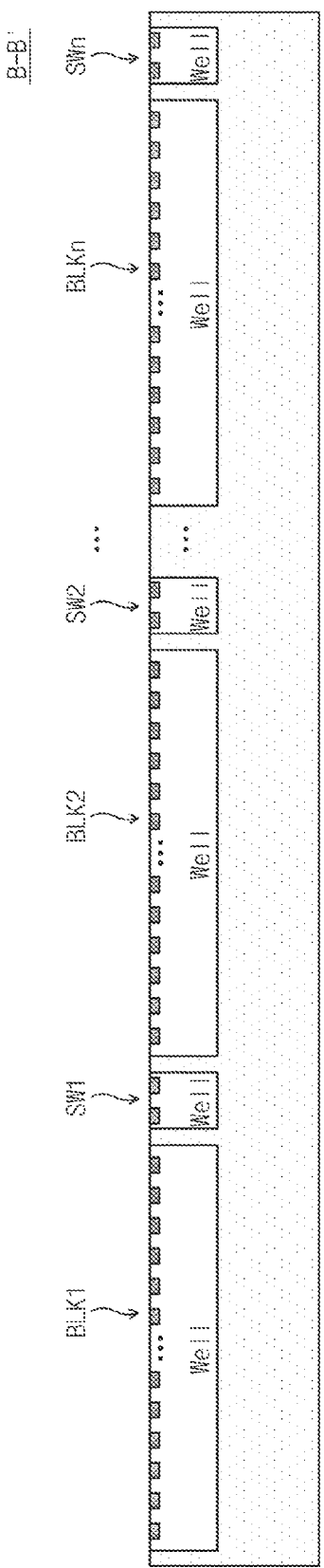
FIG. 7 is a diagram schematically illustrating a cross-sectional surface taken along dot line B-B' of FIG. 6 according to exemplary embodiments of the present general inventive concept.

FIG. 6 is a block diagram schematically illustrating a nonvolatile memory device according exemplary embodiments of the present general inventive concept. FIG. 7 is a diagram schematically illustrating a cross-sectional surface taken along dot line B-B' of FIG. 6 according to exemplary embodiments of the present general inventive concept.

Referring to FIG. 7, a nonvolatile memory device 2000 according to exemplary embodiments of the inventive concept includes a memory cell array 2100, a row decoder block 2200, and a read/writing block 2300. Although not illustrated, the nonvolatile memory device 2000 may include the bias block, the input/output interface block and the control logic block that are illustrated in FIG. 1 and described in detail above (e.g., the bias block 400, the input/output interface block 500, and the control logic block 600).

The memory cell array 2100 can include a plurality of memory blocks BLK1 to BLKn and a plurality of switch blocks SW1 to SWn. The plurality of memory blocks BLK1 to BLKn can correspond to the plurality of switch blocks SW1 to SWn, respectively. As described above with reference to FIG. 2, the memory blocks BLK1 to BLKn can be respectively formed in independent wells. As illustrated in FIG. 7, the switch blocks SW1 to SWn can be respectively formed in independent wells. As described above, wells for the memory blocks and switch blocks can be formed in an N-type well formed on a semiconductor substrate, respectively. A plurality of global bit lines GBL1 to GBLm connected to the read/writing block 2300 can be arranged in the memory cell array 2100. Each of the memory blocks BLK1 to BLKn can include a plurality of bit lines (hereinafter referred to as local bit lines). The local bit lines of each of the memory blocks BLK1 to BLKn can be connected to the global bit lines GBL1 to GBLm through corresponding switch blocks SW1 to SWn. For example, the local bit lines LBLle and LBLlo of the memory block BLK1 can be selectively connected to the global bit line GBL1 through the switch block SW1. The row decoder block 2200 can control the selection and driving of the memory blocks BLK1 to BLKn and switch blocks SW1 to SWn. This will be described below in detail.

Figure 8:
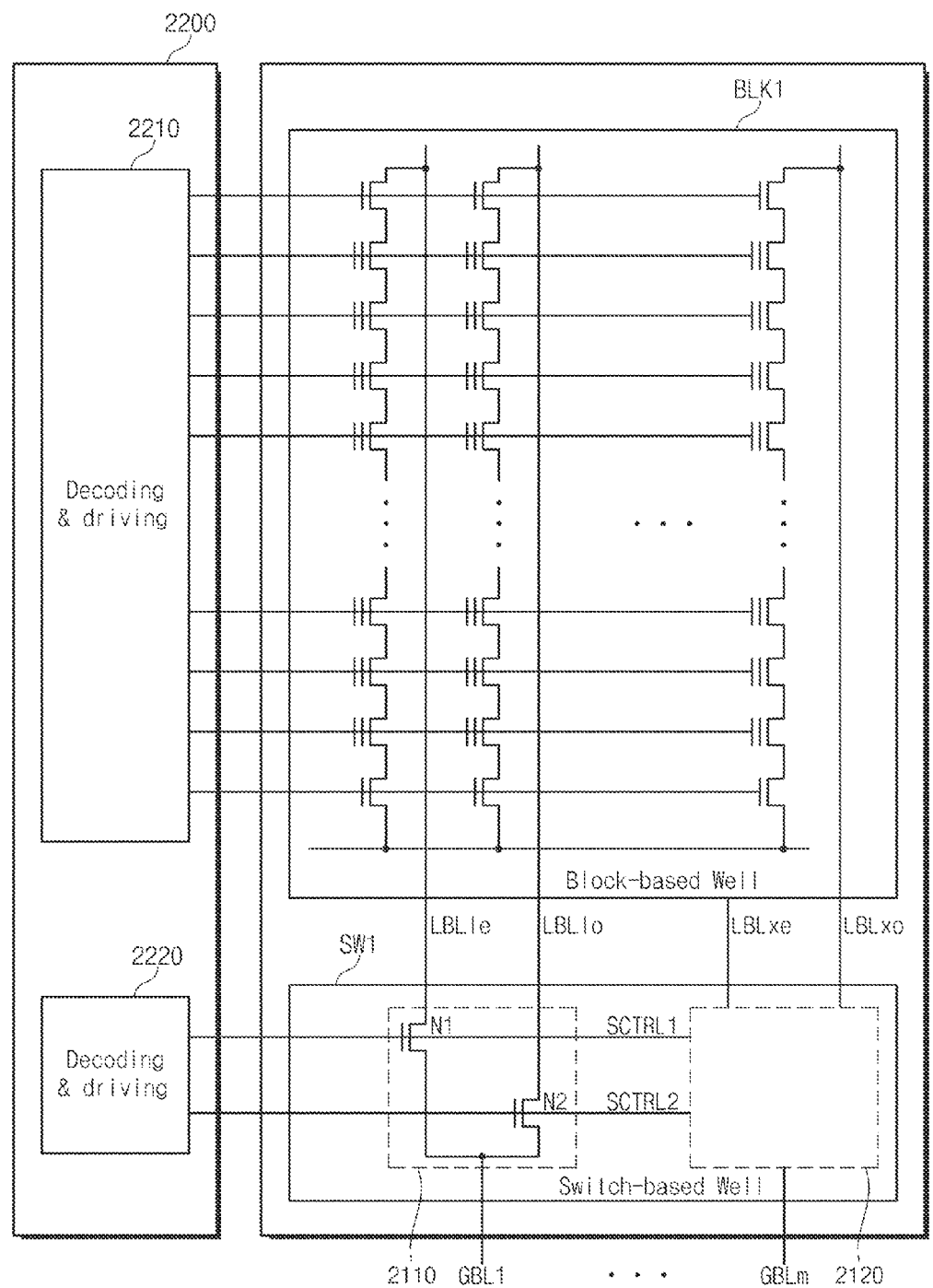
FIG. 8 is a block diagram illustrating a portion of the memory cell array and row decoder block of FIG. 6 according to exemplary embodiments of the present general inventive concept.

FIG. 8 is a block diagram illustrating a portion of a memory cell array and a row decoder block of FIG. 6 (e.g., the memory cell array 2100 and the row decoder 220o illustrated in FIG. 6). In FIG. 8, one memory block BLK1 and one switch block SW1 are illustrated. However, the remaining memory blocks BLK2 to BLKn and switch blocks SW2 to SWn may be substantially identically to those of FIG. 8.

The memory block BLK1 can be substantially the same as described in FIG. 3, and description thereof is thus omitted. The memory block BLK1 can include bit lines, i.e., paired local bit lines (LBLle and LBLlo) to (LBLxe and LBLxo). The switch block SW1 includes switches 2110 to 2120 each corresponding to local bit line pairs. The switch 2110 can be configured with two NMOS transistors N1 and N2. The NMOS transistor N1 can connect the local bit line LBLle to the global bit line GBL1 in response to a switch control signal SCTRL1, and the NMOS transistor N2 can connect the local bit line LBLlo to the global bit line GBL1 in response to a switch control signal SCTRL2. That is, one of a pair of the local bit lines LBLle and LBLlo can be connected to the global bit line GBL1 through the switch 2110. The switch control signals SCTRL1 and SCTRL2 can be generated by the decoding and driving circuit 2220 of the row decoder block 2200.

The row decoder block 2200 can include a first decoding and driving circuit 2210 to control the selection and driving of the memory block BLK1, and a second decoding and driving circuit 2220 to control the selection and driving of the switch block SW1. Particularly, the second decoding and driving circuit 2220 can activate one of the switch control signals SCTRL1 and SCTRL2 in response to address information to select the memory block BLK1 and address information to select one of a pair of bit lines. The second decoding and driving circuit 2200 can deactivate the switch control signals SCTRL1 and SCTRL2 so that the local bit lines and the global bit lines may be electrically disconnected in an erasure operation. The remaining memory blocks BLK2 to BLKn can be driven through the first decoding and driving circuit 2210 that is configured identically to the illustrated in FIG. 8, and the remaining switch blocks SW2 to SWn can be driven through the second decoding and driving circuit 2220 that can be configured identically to the illustrated in FIG. 8.

As described above with reference to FIG. 1, the nonvolatile memory device 2000 according to exemplary embodiments of the present general inventive concept can pre-charge and/or set doping regions 102 of a selected memory block to a junction voltage before a pass voltage and a programming voltage can be supplied to the word lines. Except for that the local bit lines are connected to the global bit lines through a switch block corresponding to the selected memory block, the nonvolatile memory device 2000 can be substantially identical to that described in FIG. 1, and description thereof is thus omitted. The nonvolatile memory device 2000 can obtain the same and/or similar result as that of the nonvolatile memory device 1000 which is illustrated in FIG. 1. That is, the reliability of the memory cells (or the nonvolatile memory device) can be improved and/or increased by reducing a programming voltage stress.

By connecting the local bit lines of a selected memory block to the global bit lines through a switch block, the loading of the global bit lines may be minimized. The minimization of bit line loading can improve a read speed. By minimizing bit line loading, the application of a mat structure can be excluded upon designing of a large-capacity chip. The mat structure can support the adding of the row decoder block, the read/writing block, and the bias block. By excluding the application of the mat structure, a chip size may be reduced upon designing of a large-capacity chip. By forming a memory block in an independent well, the increase of an incremental step pulse programming "ISPP" time (or a programming time) can be suppressed in a programming operation. This is because only the independent well of a selected memory block may be biased to a well voltage in the programming operation. By widening a distance between the global bit lines through the switch blocks, the increase of a coupling capacitance can be minimized.

The programming operation can be performed using a bias condition for an F-N tunneling. For example, the F-N tunneling can occur by a voltage difference between a well voltage and a control gate voltage (i.e., a word line voltage). Such a voltage difference may be provided by a plurality of methods. For example, by applying a voltage of about 0 V to a well and a word line voltage of about 15 V (i.e., a programming voltage) to a control gate, the F-N tunneling may occur. The bit lines can be driven to about 0 V or a power source voltage according to a programming data. Alternatively, by applying a negative voltage (for example, −5 V) to a well (including a well of a memory block and a well of a switch block) and a word line voltage of about 10 V (i.e., a programming voltage) to the control gate, the F-N tunneling may occur. The bit lines can be driven to about 0 V or a negative voltage (for example, −5 V) according to the programming data. The programming method according to exemplary embodiments of the present general inventive concept is not limited to the bias conditions (bias condition for the F-N tunneling) that are disclosed herein.

Figure 9:
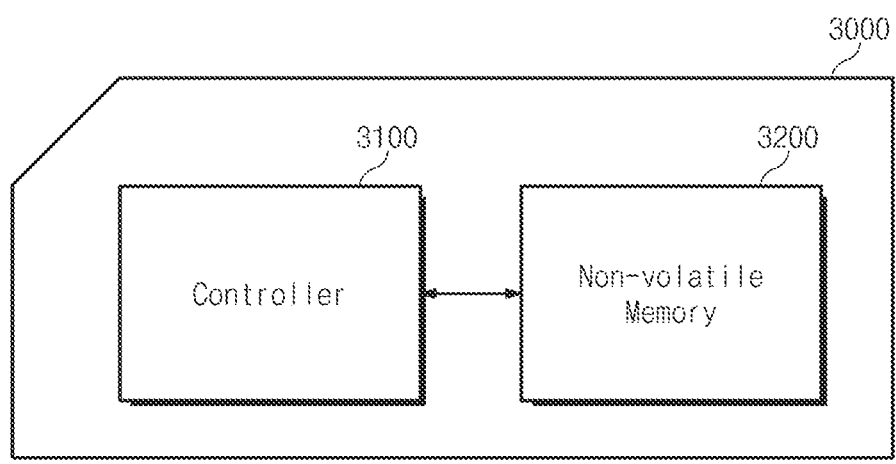
FIG. 9 is a block diagram schematically illustrating a memory system which includes a nonvolatile memory device according to exemplary embodiments of the present general inventive concept.
Figure 10:
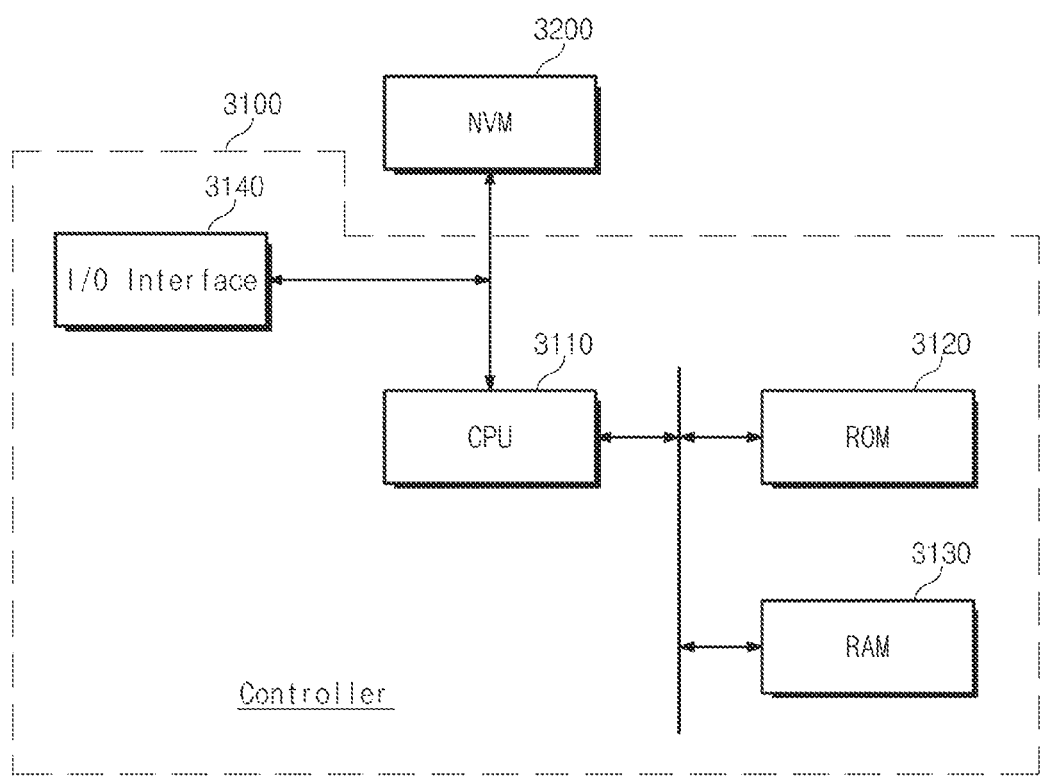
FIG. 10 is a block diagram schematically illustrating a controller in FIG. 9 according to exemplary embodiments of the present general inventive concept.

FIG. 9 is a block diagram schematically illustrating a memory system which includes a nonvolatile memory device according to exemplary embodiments of the present general inventive concept. FIG. 10 is a block diagram schematically illustrating a controller in FIG. 9.

Referring to FIG. 9, a memory system 3000 according to exemplary embodiments of the present general inventive concept may be an integrated circuit card such as a smart card or a memory card. The memory system 3000 can include a controller 3100 and a nonvolatile memory device 3200. The nonvolatile memory device 3200 can be substantially identical to that of FIG. 1 or FIG. 6. The nonvolatile memory device 3200 can store data according to the programming method of exemplary embodiments of the present general inventive concept described herein. The controller 3100, as illustrated in FIG. 10, can include a Central Processing Unit (CPU) 3110, a Read Only Memory (ROM) 3120, a Random Access Memory (RAM) 3130, and an input/output interface 3140. The controller 3100 may encode and/or decode data, and can perform error correction and security, according to one or more fields to which the integrated circuit card 3000 is applied.

Figure 11:
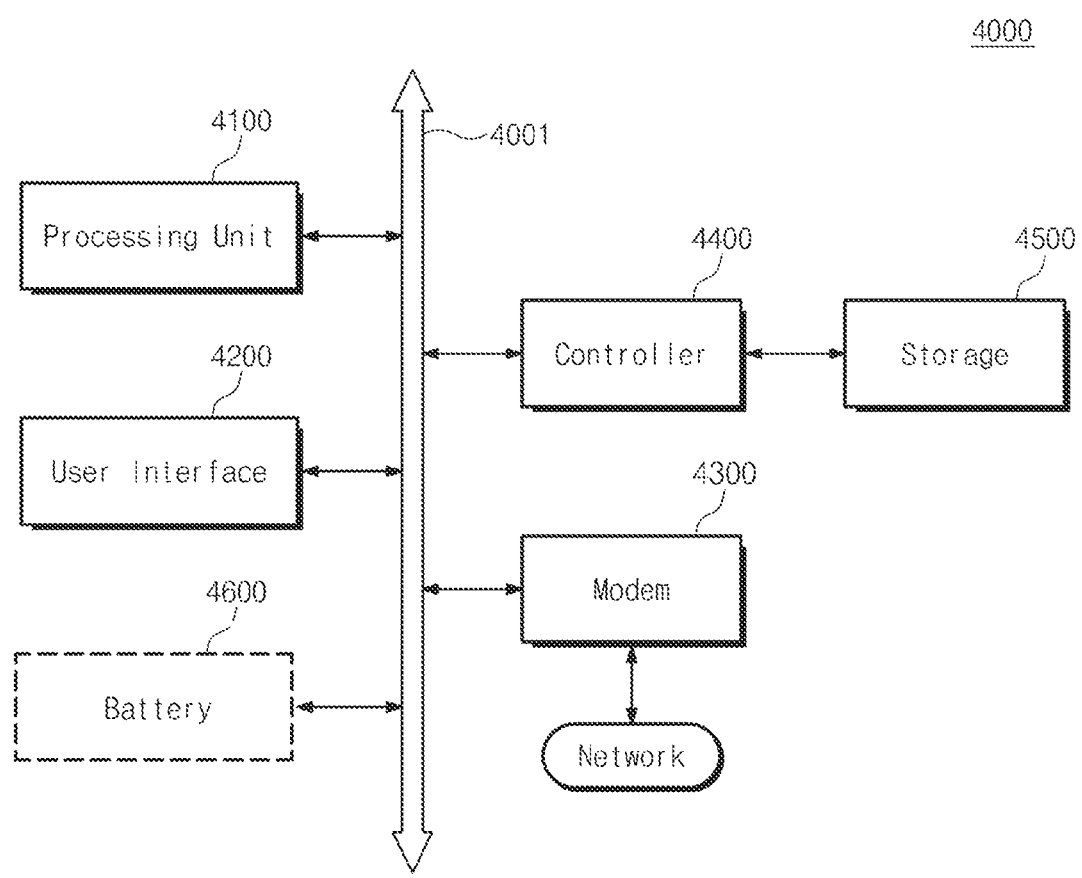
FIG. 11 is a block diagram schematically illustrating a computing system which includes a nonvolatile memory device according to exemplary embodiments of the present general inventive concept.

FIG. 11 is a block diagram schematically illustrating a computing system which includes a nonvolatile memory device according to exemplary embodiments of the present general inventive concept.

Referring to FIG. 11, a computing system 4000 according to exemplary embodiments of the present general inventive concept can include a microprocessor 4100, a user interface 4200, a modem 4300 such as a baseband chipset, a controller 4400 and a storage medium 4500 that are electrically connected to the bus 4001. The storage medium 4500 can include a nonvolatile memory device according to the exemplary embodiments of the present general inventive concept disclosed herein. N-bit data (where N is 1 or an integer more than 1), which has been processed or is to be processed by the microprocessor 4100, can be stored in the storage medium 4500. When the computing system 4000 is a mobile device, it may include a battery 4600 to supply the operation voltage of the computing system 4000. Although not illustrated, the computing system 4000 may include an application chipset, a Camera Image Processor (CIS) and a mobile Dynamic Random Access Memory (DRAM). The controller 4400 and the storage medium 4500 may include a memory card, a Solid State Drive/Disk (SSD), and/or a hard disk drive (HDD).

The storage medium and/or the controller according to the exemplary embodiments of the present general inventive concept may be mounted with one or more types of packages. For example, the storage medium and/or the controller according to exemplary embodiments of the present general inventive concept may be mounted with packages such as Package on Package (PoP), Ball Grid Arrays (BGAs), Chip Scale Packages (CSPs), Plastic Leaded Chip Carrier (PLCC), Plastic Dual In-Line Package (PDIP), Die In Waffle Pack (DIWP), Die In Wafer Form (DIWF), Chip On Board (COB), Ceramic Dual In-Line Package (CERDIP), Plastic Metric Quad Flat Pack (MQFP), Thin Quad Flat Pack (TQFP), Small Outline Package (SOP), Shrink Small Outline Package (SSOP), Thin Small Outline Package (TSOP), Thin Quad Flat Pack (TQFP), System In Package (SIP), Multi Chip Package (MCP), Wafer Level Stack Package (WLSP), Die In Wafer Form (DIWF), Die On Waffle Package (DOWP), Wafer-level Fabricated Package (WFP) and Wafer-Level Processed Stack Package (WSP).

According to exemplary embodiments of the present general inventive concept, the nonvolatile memory device can decrease the voltage difference between the programming voltage and the channel voltage and can reduce stresses that are given to the programming-prohibited memory cells.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

Although several embodiments of the present invention have been illustrated and described, it would be appreciated by those skilled in the art that changes may be made in these embodiments without departing from the principles and spirit of the general inventive concept, the scope of which is defined in the claims and their equivalents.

What is claimed is:

1. A nonvolatile memory device, comprising:
   a plurality of memory blocks formed in wells, respectively;
   a bias block to apply a junction voltage to a well of a selected one of the memory blocks; and
   a control logic block to control the bias block to pre-charge doping regions of the selected memory block to the junction voltage as a result of biasing the well and to discharge the junction voltage provided to the well through the bias block while maintaining the junction voltage of the doping regions before word line voltages are applied to the selected one of the memory blocks in a programming operation,
wherein the memory blocks are respectively formed in independent wells.

2. The nonvolatile memory device of claim 1, wherein when the word line voltages are applied to the selected memory block, the junction voltages of the doping regions of the selected memory block are boosted by the word line voltages, and the boosted junction voltages are added to channel voltages of strings of the selected one of the memory blocks.

3. The nonvolatile memory device of claim 2, wherein the doping regions are source/drain regions of memory cells of the selected one or the memory blocks.

4. The nonvolatile memory device of claim 1, further comprising:
switch blocks each corresponding to the plurality of memory blocks.

5. The nonvolatile memory device of claim 4, wherein each of the memory blocks comprises:
first bit lines;
wherein the first bit lines in each memory block are connected to second bit lines through a corresponding switch block, respectively.

6. The nonvolatile memory device of claim 5, wherein the switch blocks isolate the first bit lines of the memory blocks and the second bit lines at an erase operation.

7. The nonvolatile memory device of claim 4, wherein the switch blocks are respectively formed in independent wells.

8. A method of programming a nonvolatile memory device including a plurality of memory blocks, the method comprising:
applying a junction voltage to a well of a selected one of a plurality of memory blocks;
pre-charging doping regions of the selected memory block of the plurality of memory blocks to a junction voltage as a result of biasing the well;
driving bit lines of the selected memory block to one of a bit line programming voltage and a bit line program-inhibition voltage according to data to be programmed;
discharging the junction voltage provided to the well while maintaining the junction voltage of the doping regions;
driving word lines of the selected memory block to a pass voltage; and
driving a selected one of the word lines in the selected memory block to a programming voltage,
wherein the memory blocks are respectively formed in independent wells.

9. The method of claim 8, wherein when the pass voltage and the programming voltage are applied to the selected memory block, the junction voltages of the doping regions of the selected memory block are boosted by the pass voltage and the programming voltage, and the boosted junction voltages are added to channel voltages of strings of the selected memory block.

10. The method of claim 9, wherein the doping regions are source/drain regions of memory cells of the selected memory block.

11. A method of programming a nonvolatile memory device including a plurality of memory blocks, the method comprising:
supplying a junction voltage to a selected one of the memory blocks, each formed in independent wells, so as to bias the well of the selected memory block, controlling a pre-charging of doping regions of the selected memory block to the junction voltage as a result of biasing the well, and discharging the junction voltage supplied to the well while maintaining the junction voltage of the doping regions before supplying a selected word line in the selected memory block with a programming voltage.

12. The programming method of claim 11, further comprising:
applying a bit line voltage to bit lines of the selected one of the memory blocks; and
applying a pass voltage to word lines of the selected one of the memory blocks, applying a bit line voltage, and applying a pass voltage being carried out before supplying a selected word line in the selected one of the memory blocks with a programming voltage.

13. The programming method of claim 12, wherein applying a bit line voltage to bit lines of the selected one of the memory blocks comprises:
connecting bit lines of the selected one of the memory blocks with corresponding global bit lines via a switch block.

14. The programming method of claim 13, wherein the switch block disconnects the bit lines of the selected one of the memory blocks with the corresponding global bit lines at an erase operation.

15. A memory system, comprising:
a nonvolatile memory device, including:
a bias block to apply a junction voltage to a well of a selected one of a plurality of memory blocks; and
a control logic block to control the bias block to pre-charge doping regions of the selected memory block to the junction voltage as a result of biasing the well and to discharge the junction voltage provided to the well through the bias block while maintaining the junction voltage of the doping regions before word line voltages are applied to the selected memory block in a programming operation; and
a controller to control the nonvolatile memory device,
wherein the nonvolatile memory device includes the plurality of memory blocks formed in wells, respectively.

16. The memory system of claim 15, wherein when the word line voltages are applied to the selected one of the plurality of memory blocks, the junction voltages of the doping regions of the selected memory block are boosted by the word line voltages, and the boosted junction voltages are added to channel voltages of strings of the selected one of the memory blocks.

17. The memory system of claim 16, wherein the doping regions are source/drain regions of memory cells of the selected one of the plurality of memory blocks.

18. The memory system of claim 17, further comprising:
switch blocks that each correspond to the memory blocks and that are formed in independent wells.

19. The memory system of claim 18, wherein each of the memory blocks comprises:
first bit lines;
wherein the first bit lines in each memory block are connected to second bit lines through a corresponding switch block, respectively.

* * * * *